United States Patent

Kahn

[15] 3,648,186

[45] Mar. 7, 1972

[54] AMPLIFICATION SYSTEM

[72] Inventor: Leonard R. Kahn, Freeport, N.Y.

[73] Assignee: Kahn Research Laboratories, Inc., Freeport, Long Island, N.Y.

[22] Filed: Mar. 24, 1970

[21] Appl. No.: 22,386

Related U.S. Application Data

[63] Continuation of Ser. No. 610,306, Jan. 19, 1967, abandoned.

[52] U.S. Cl. ................................330/10, 330/124, 325/142, 325/182

[51] Int. Cl. ..........................................................H03f 3/38

[58] Field of Search ..............325/182, 142, 38, 185; 330/10, 330/124, 9; 321/60; 332/9

[56] References Cited

UNITED STATES PATENTS

| | | | |
|---|---|---|---|
| 2,084,180 | 6/1937 | Barton | 179/1 |
| 2,227,596 | 1/1941 | Luck | 325/142 X |
| 2,411,130 | 12/1946 | Evans | 325/142 X |
| 3,253,228 | 5/1966 | Montner | 332/10 |
| 3,348,151 | 10/1967 | Holmes | 325/185 |
| 3,413,570 | 12/1968 | Bruene et al | 332/9 |

*Primary Examiner*—Benedict V. Safourek
*Attorney*—Graybeal, Cole & Barnard

[57] ABSTRACT

An electrical signal amplification unit wherein an audio or other low-order frequency input signal width-modulates a pulsed signal having an intermediate order repetition frequency at least twice the frequency of the low-order input frequency. The width-modulated pulsed signal is then employed to key an RF carrier wave which is then amplified in Class C amplifier stages. After pulse detection, the low-order frequency signal components are isolated and fed to a utilization circuit, such as an AM transmitter. Alternate circuits are provided for amplifying both the AC and DC components, or only the AC signal components of the input signal, and for monophase detection, or polyphase detection at high-power levels.

21 Claims, 4 Drawing Figures

AMPLIFICATION SYSTEM

This application is a continuation of my parent application, Ser. No. 610,306, filed Jan. 19, 1967, and now abandoned.

BACKGROUND OF THE INVENTION

The present invention relates to amplification of signals of low-order frequency, wherein the signal amplifier has the capability of high-level power output on the order of 100 watts power output energy or more, with high efficiency and good linearity. More particularly, the invention relates to a power amplifier unit wherein a low-order frequency signal width-modulates pulsed energy having an intermediate-order pulse repetition frequency, with the modulated intermediate-order frequency pulses in turn being employed to modulate or key a radiofrequency carrier wave, the modulated radiofrequency carrier wave then being amplified to a desired energy level, then established at an impedance suitable for use of the signal in a utilization circuit (such as the audio modulation stage of an amplitude-modulated or like transmitter), the low-order frequency components of the resultant modulated radiofrequency carrier wave after amplification then being isolated and applied to the utilization circuit.

Particular aspects of the invention include the provision of alternate forms of amplifiers wherein only the AC signal components, or both the DC and AC signal components, of the initial low-order frequency signal are amplified to a high energy level and delivered to the utilization circuit. Aspects of the invention also relate to either monophase and polyphase signal detection circuits especially adapted for recombining and isolating the low-order frequency components of the amplified radiofrequency signals at high power levels.

As will be apparent from the following more specific discussion of typical embodiments of the invention, units incorporating same characteristically include so-called pulse width or pulse duration modulators developing a variably pulsed or variably keyed intermediate-order frequency signal in turn modulating a radiofrequency carrier wave then developed to a high power level in high-efficiency RF amplification means of a class C type.

By way of example, the embodiments of the present invention shown in the drawings and described hereinafter relate to systems for amplifying audio signals (e.g., signals having frequencies of less than about 10 kc. or 20 kc.). However, it is to be understood that the invention has utility for amplification of low-order frequency input signals occupying a spectrum not necessarily restricted to or within the audio range, the important functional considerations characterizing the invention being that the pulsed wave width modulated by the input signal has a repetition frequency at least about twice the highest frequency component of the input signal, and that the RF wave keyed by width-modulated pulses is at a frequency substantially greater than the pulse repetition frequency, e.g., at least about ten times the pulse repetition frequency.

Pulse-type audio amplifiers for power amplification of audio waves by use of pulse techniques have been known for a number of years. Conventionally, the general scheme of this known technique is to modulate a pulsed energy source in a manner so that the pulse width varies as a linear function of the frequency of the audio wave to be amplified. The resultant modulated pulses can then be amplified to a high energy level in pulse amplifiers, the output from which is fed to a low-pass filter which separates the desired audio wave from the harmonic pulse energy components. Such pulse amplifiers are conventionally operated at a pulse repetition frequency in the audio frequency range, so that the first harmonic or audio output therefrom when employed as the input to the high-level modulation stage of an amplitude modulation or like transmitter must first be passed through an audiofrequency transformer designed to have the fidelity and to handle the high energy levels necessary for AM transmitter modulation.

The major disadvantage of all conventional audio amplification systems used for transmitter modulation is that they require a high-energy-level audio transformer, which must meet rigid design specifications and is necessarily a quite large and expensive piece of equipment. In equipments where extremely good low-frequency response is required, such as in the commercial broadcasting field or where clipped waves must be amplified, the size and cost of the audio transformer are further aggravated. Also, in some transmitter equipments, such as the so-called envelope elimination and restoration (EER) system (such as disclosed in my U.S. Pat. No. 2,666,133), the audio signal includes an essential DC component which is blocked by a conventional audio transformer, rendering use thereof impossible.

SUMMARY OF THE INVENTION

It is a basic object, feature and advantage of the present invention to obviate the necessity of using large and expensive audio transformers in high-gain, high power output audio amplification systems, and permit replacement thereof with small, low-cost, tuned radiofrequency transformer or like impedance-matching means. A related object and advantage of amplification systems according to the present invention is that they have excellent low frequency response characteristics, limited only by the characteristics of the associated utilization circuitry, such as the audiofrequency modulation choke in the AM transmitter, in the case where the amplified audiofrequency signal is fed to this form of utilization circuit. Yet another object, feature and characteristic of amplification systems according to the present invention is that they are characterized by a high efficiency which is relatively constant for various modulation levels, thus providing excellent overall efficiency of the system. Still another feature and characteristic is that the system has very good response linearity (i.e., no inherent distortion), and the modulation characteristics are relatively insensitive to variations in tube parameters.

BRIEF DESCRIPTION OF THE DRAWINGS

These and other objects, features, characteristics and advantages of the systems and signal development techniques of the invention will be apparent from the following description of certain typical forms thereof, taken together with the accompanying drawings, wherein like letters and numerals refer to like parts and prime letters and numerals refer to similar parts, and wherein.

DESCRIPTION OF THE PREFERRED EMBODIMENTS

Figures 1, 2:
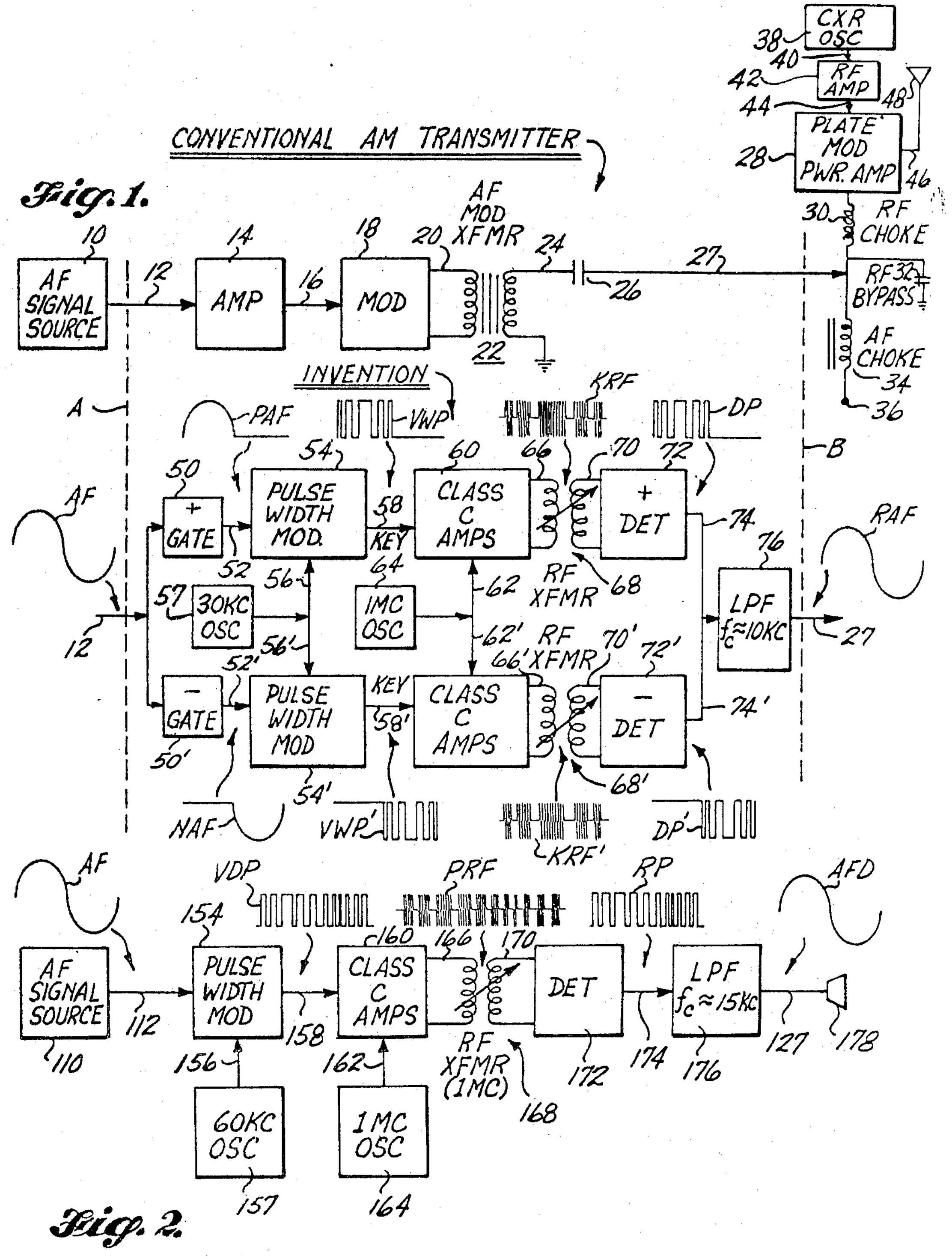
FIG. 1 is a simplified block diagram, compositely showing in its upper portion a conventional amplitude modulation (AM) transmitter, and showing in its lower portion a form of the present invention suitable for substitution into the conventional transmitter system to eliminate the conventional modulator stage and conventional audiofrequency transformer, the amplification system of the invention in this instance being bichannel, characterized by having positive and negative signal channels and developing only the AC components of the audiofrequency signal input.
FIG. 2 is a diagrammatic showing of a modified form of amplification system according to the present invention, involving a single signal path and development of both the AC and DC signal components of the audiofrequency input signal.

As shown in FIG. 1, a conventional AM transmitter system comprises an audiofrequency signal source 10 developing an initial audio signal input 12 fed to one or more audio amplification stages 14, from which an audio signal 16 at intermediate energy level is fed to a so-called modulator 18. Modulator 18 actually functions basically as an audiofrequency power amplifier, developing a high energy level, audiofrequency output 20 in turn applied across the primary of an audiofrequency modulation transformer 22 which, as earlier indicated, is necessarily bulky and expensive. Use of the modulation transformer 22 in the audio signal path of a conventional AM transmitter system is necessary, however, in order to provide proper impedance matching between the output of the modulator stage 18 and the modulated power amplifier stage of the transmitter. Such output, indicated in FIG. 1 at 24, passes through coupling capacitance 26 and becomes output 27 to the input circuit of transmitter plate modulated power amplifier 28, such input circuit in the instance shown in FIG. 1 including RF choke 30, RF bypass capacitance 32, and AF choke 34, as well as plate supply voltage source 36. A radiofrequency carrier source such as crystal oscillator 38, the output 40 from which is suitably amplified as in one or more RF amplifier stages 42, provides the carrier energy input 44 to the plate-modulated power amplifier 28, and the output 46 therefrom is coupled to the transmitting antenna means of the system, such as schematically designated at 48.

As shown in FIG. 1, amplification stage(s) 14, power modulator 18 and modulation transformer 24 of the conventional transmitter AF channel are replaced (as diagrammatically shown by the broken lines designated A and B) with a bichannel audio signal amplification circuit typical of the present invention. Specifically, the substituted audio signal development circuit comprises respective positive and negative gates 50, 50′ (suitably simple diode circuits, conventional per se), which respectively develop from the initial audiofrequency input 12 (typically including frequencies less than 10 kc., and shown in simplified form by the waveform designated AF), respective gated outputs 52 (the positive portion of the audio input wave, as shown by waveform PAF) and 52′ (the negative portion of the audiofrequency input wave, as shown by waveform NAF).

The two channels of the audio amplification system shown in FIG. 1 are identical except for the polarity of the audio input thereto and the polarity of the wave developed in each channel, and specific consideration need be given to only one channel of the circuit. In this respect, the positive gated output 52 is fed to a pulse width modulator 54 which also receives an input 56 from an ultra-audio-frequency local oscillator 57, the operating frequency of which is well above the highest audiofrequency component of the audiofrequency input signal 12 (30 kc. being selected as the operating frequency of local oscillator 57 as a typical example).

As will be understood, the pulse width modulator 54 is per se well known in the art. Typical disclosures of this type of circuit may be found in the Terman text entitled "Radio Engineering," 3rd Ed. (1947), published by McGraw-Hill Company, at pages 775–778, and bibliography thereat; as well as in the test by Harold S. Black entitled "Modulation Theories," published by D. Van Nostrand & Company, N.Y., N.Y., (1953), at pages 264–276.

As is also known, the basic principle of pulse width modulation or pulse duration modulation involves variation of either the leading or lagging edges of the pulses, or both, in a substantially linear manner as a function of the modulating signal. A discussion of pulse width modulation theory can be found, for example, in the John C. Hancock text entitled "An Introduction to the Principles of Communication Theory," published by McGraw-Hill (1961), at pages 65–67.

From inputs 52, 56, pulse width modulator 54 develops an output 58 comprised of pulses having a pulse repetition frequency of 30 kc., which pulses are all of like amplitude and of variable width, with the higher instantaneous amplitudes of the input-modulating signal 52 producing correspondingly wider pulses and a larger average amplitude at output 58. In the signal channel shown, the pulse width modulator 54 is designed to develop output pulses in the positive portions of the modulating input signal 52 and to develop no pulse output during the zero voltage portion of the input-modulating signal 52. Such output 58 is portrayed approximately by the waveform designated VWP (i.e., variable width pulse).

The output 58 of the pulse width modulator 54 is employed as a modulating or keying input to the first stage of class C amplifier means 60, which first stage also receives an input 62 from radiofrequency carrier wave source 64 (suitably a local oscillator operating at 1MC, for example). As will be understood, the class C amplifier means 60, operating in class C mode and at radiofrequency, provide simple and highly efficient signal amplification. The radiofrequency output 66 from the class C amplification means 60 characteristically is a keyed or pulsed RF wave, with the RF pulses or "spurts" being of like amplitude and varying in width in a manner directly corresponding to the widths of the variable-width keying input pulses (waveform VWP). Such output 66 is approximated by the waveform designated KRF (i.e., keyed radiofrequency wave), which is shown in FIG. 1 with an expanded time base in its active portion and with an abbreviated time base in its inactive portion, for improved clarity.

The output 66 is applied to the primary of radiofrequency transformer 68, which functions to transform the impedance of the signal to that desired for optimum efficiency in the utilization circuit to which the signal is subsequently applied. Such radiofrequency transformer 68 thus performs a function directly comparable to the conventional audiofrequency modulation transformer 22, but is much simpler, being simply a tuned RF circuit with consequent good linearity and high efficiency.

Secondary output 70 from radiofrequency transformer 68 is in turn applied to detection stage 72 (suitably simply a biased diode or triode rectifier; cf. FIGS. 3 and 4), which develops a pulsed output signal 74 having pulse widths which correspond to the pulse widths of the variable-width pulses appearing as the lower energy output 58 from the pulse width modulator 54, but at the desired output power level and desired impedance. The detected, variable-width pulse, ultraaudio output 74 is approximated in FIG. 1 at the waveform designated DP (i.e., detected pulses).

The detected pulse output 74, after being combined with a corresponding detected pulse output 74′ from the other signal channel of the circuit, is then applied to low-pass filter 76 (typically having a cutoff frequency $f_c$ of 10 kc.) which functions to block ultraaudio components of the signal, producing the positive part of audio output 27 symbolized by waveform RAF (i.e., reconstituted audio frequency), which is then applied to the utilization circuit (i.e., the audiofrequency input circuit of the AM transmitter, in the selected example presented by FIG. 1).

As will be understood, the second signal channel shown in the lower portion of FIG. 1 develops from gated output 52′ to pulse width modulator 54′ (which also receives an input 56′ from ultraaudio local oscillator 58), a variable-width pulse output 58′ (shown by waveform VWP′) which in turn keys the power amplification means 60′ (in turn also receiving a radiofrequency carrier input 62′ from local oscillator 64), with the amplified output 66′ (shown by waveform KRF′) being applied to RF transformer 68′, the secondary output 70′ from which is acted on by detector means 72′ to produce the high energy level, ultraaudio frequency, pulsed output 74′ (as shown by waveform DP′) which is combined with the other channel detected output 74 then acted on by low-pass filter 76 to provide the negative part of the reconstituted audiofrequency output 27.

As indicated, the RF transformers 68, 68′ may be of the simple air core, tuned RF transformer type, constructed in accordance with conventional radiofrequency transformer design techniques. The loaded Q of these transformers should be on the order of three in order to assure high transformer efficiency, and the nonloaded Q should be as high as practicable.

The high power level impedance transformation at RF frequency, as employed in practice of the present invention, can also be accomplished by use of a so-called pi network or other known impedance-transforming circuit. However, simple, conventional RF transformer means are considered to be the most practical for the purpose.

FIG. 2 illustrates a modified embodiment of the invention characterized by amplification of both the AC and DC components of an audiofrequency input signal. In this case, the audiofrequency signal source 110 produces an audiofrequency input signal 112 (shown by waveform AF) to the pulse width modulator 154 which also receives an ultraaudio input 156 from local oscillator 157, which in this instance is operated at 60 kc. In pulse width modulator 154, the modulating level is maintained so that the 60 kc. pulses appearing in output 158 are of a median width coincident with the instantaneous zero value of the input audio signal 112, with pulse width progressively increasing coincident with positive values thereof and decreasing with negative values thereof. This pulsed output 158 is approximated by the waveform shown in FIG. 2 at VDP (i.e., variable duration pulses). As will be understood, any DC component in the audiofrequency input 112 is reflected as the average pulse duration in the output of pulse width modulator output 158, so is not lost from the signal.

In FIG. 2, and in the manner characteristic of the invention, the ultraaudio variable-width pulses available at modulator output 158 are employed to key, in Class C amplification means 160, a radiofrequency carrier wave input 162 obtained from local oscillator 164 (operated at 1 mc. for example), and the high energy level, keyed output 166 from the Class C amplification stages 160 is delivered to tuned radiofrequency transformer 168 to transform the impedance thereof to that desired in the utilization circuit. The waveform of the pulsed radio frequency signal appearing at transformer 168 is shown at waveform PRF (i.e., pulsed radio frequency), on an expanded time base, for clarity.

Secondary output 170 from the transformer 168 is fed to detection means 172, the output 174 from which is the recovered ultraaudio pulses at high energy level, as approximated by waveform RP. Low-pass filter 176 isolates from this output the audiofrequency components (with filter 176 in this instance having a cutoff frequency of $f_c$ of 15 kc., for example), and the recovered audiofrequency output 127 (indicated by waveform AFD, i.e., audiofrequency with DC component) is fed to the utilization device 178 which, in FIG. 2, is simply schematically shown as a speaker, but which can be any device wherein the presence of the DC component of an audiofrequency input signal is desired or necessary, such as the audiofrequency modulation stages of an EER suppressed carrier transmitter.

Figure 3:
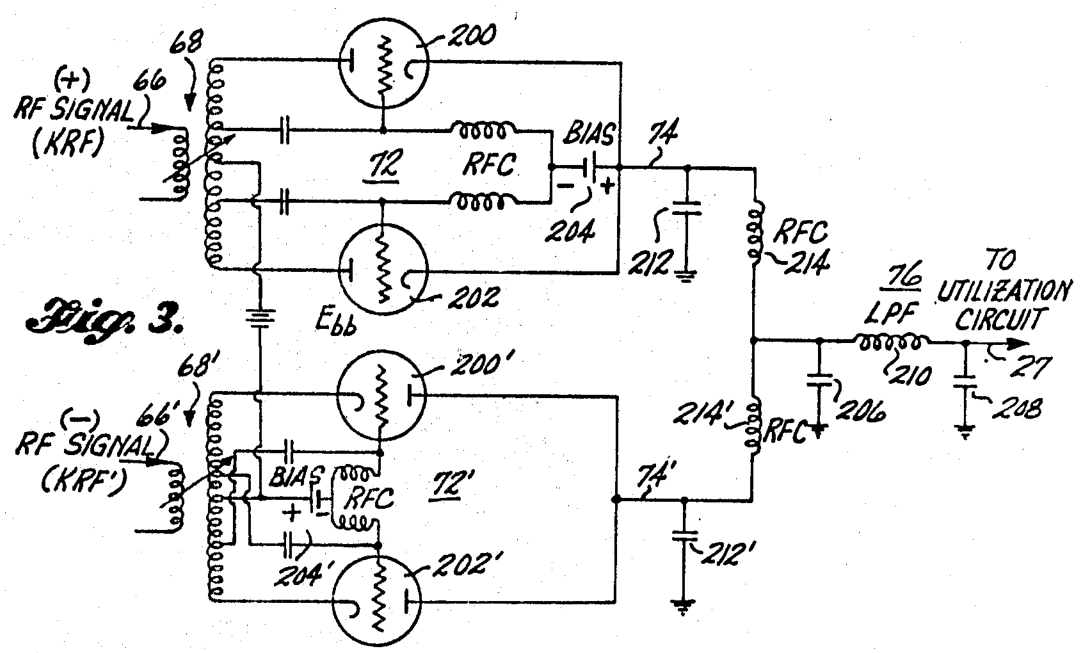
FIG. 3 is a schematic showing of the detector and low-pass filter output stages of the amplification system shown in FIG. 1, with full-wave detection of each radiofrequency signal in single-phase.

FIG. 3 shows typical detector and output filter circuitry such as may be used in the system shown in FIG. 1, i.e., RF transformers 68, 68′, full-wave detector stages 72, 72′ and the low-pass filter 76. Detection by full-wave rectification is employed in each channel. In positive channel detector 72, for example, triodes 200, 202 (which can be solid-state devices such as silicon control rectifiers or transistors) are negatively biased from bias source 204 and function to provide full-wave rectification of the RF signal. Similarly, the detection circuit 72′ to which the other channel signal transformer 68′ is connected, comprises triodes 200′, 202′ and bias source 204′. The two pairs of triodes 200, 202 and 200′, 202′ each operates as full-wave rectifiers in the manner conventional per se, and the respective outputs 74, 74′ therefrom are combined and the audiofrequency components thereof selected in a low-pass filter 76 comprising capacitances 206, 208 and inductance 210, with bypass capacitances 212, 212′ and RF chokes 214, 214′ being typically provided in the detected signals combining circuit. As will be observed, the detection circuits shown at FIG. 3 are characterized by a single-phase relationship of the detected RF signals.

Figure 4:
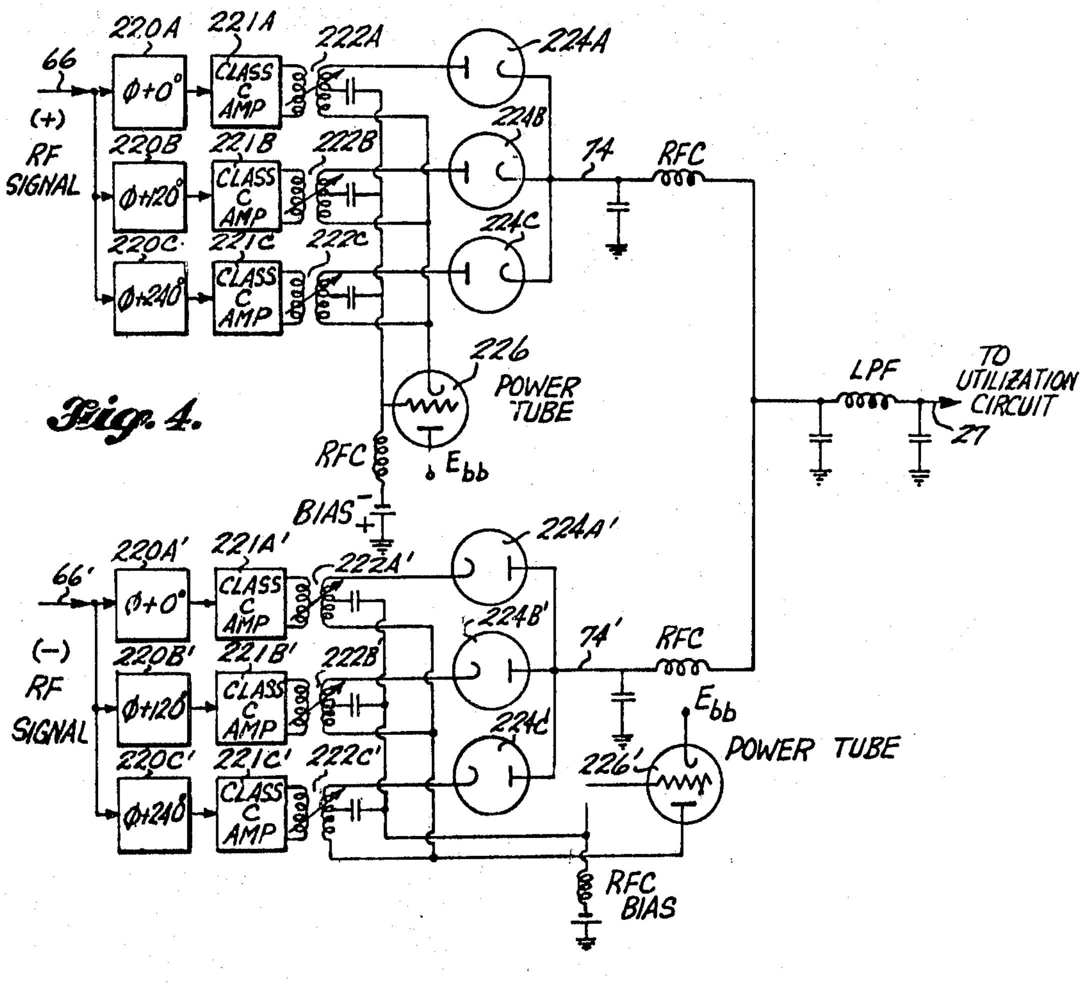
FIG. 4 is a schematic showing of a modified detection and low-pass filter output circuit for use in amplification systems according to the invention, wherein each amplified radiofrequency signal is split into polyphase components with each resulting component undergoing detection, to materially improve system efficiency.

It is an inherent characteristic of single-phase rectification that the efficiency is limited to approximately 82 percent. In order to provide higher system efficiency, it is desirable to use polyphase rectification of the keyed RF signal in each channel of the system. A polyphase rectification circuit suitable for the purposes is shown at FIG. 4. Basically, the FIG. 4 circuit involves splitting of the keyed RF signals into three phases, then detecting the audio and ultraaudio components of each signal separately, with the detected signal then being combined and the audio components thereof isolated in the same manner as in the FIG. 3 circuit.

Specifically, as shown in FIG. 4, the respective keyed RF signals 66, 66′ are passed to respective parallel arrays of phase shift networks 220A, 220B, 220C, and 220A′, 220B′, 220C′ which are conventional per se and provide, at the applied radio frequency (1 mc.), relative phase shifts of $\theta$+0° (in the instance of networks 220A and 220A′), of $\theta$+120° (in the instance of networks 220B and 220B′, and of $\theta$+240° (in the instance of networks 220C and 220C′). After the respective three signal branches are established at the indicated relative phases, the signals are amplified in class C amplifiers 221A, 221B, 221C, 221A′, 221B′ and 221C′, and then applied to respective RF transformers 222A, 222B, 222C, 222A′, 222B′ and 222C′, the secondary outputs from which are applied to respective half-wave rectifier circuits comprising respective diodes 224A, 224B, 224C, 224A′, 224B′, 224C′. As shown in FIG. 4, the Class C amplifiers 221A–C and 221A′–C′ are preferably connected in their respective branches after the phase shift networks 220A–C and 220A′–C′ so that their inefficiency does not create additional power loss. Alternatively, however, a single amplifier (not shown) may be employed to amplify each of the keyed RF signals 66 and 66′ and feed them to the phase shift networks.

While this detection system requires a total of six separate detection channels and associated RF transformers, each of these channels is at a considerably lower power level (i.e., 1/6 the power level as compared with use of a single signal channel as in FIG. 2, or ⅓ the power level as compared with use of two signal channels, as in FIG. 1), and it is considered that division of the RF signals as in the FIG. 4 circuit actually is more economical and easier to accomplish than attempting to perform the desired signal transformation and detection in a fewer number of higher power level channels. In FIG. 4, various diodes 224A–C and 224A′–C′ have DC return paths through respective power triodes 226, 226′ (which could also be tetrodes or pentodes), functioning to cut off the negative channel (by nonconduction of tube 226′) when the positive channel is active, and to cut off the positive channel (by nonconduction of tube 226) when the negative channel is active. The return power tubes 226, 226′ are keyed by the RF signal applied to the detectors, and each conducts only when at least one of the three associated diodes is activated. Each power tube passes half of the average current produced by the composite detection circuit, and is of course essentially inactive during low modulation periods, as is the rest of the circuit. As will be apparent, silicon control rectifiers or transistors can also be used in lieu of the power tubes 224A–224C′.

The approximate power requirement of an audio amplification system employing a polyphase detection circuit such as shown at FIG. 4 is of considerable interest. For example, assuming that a 180 kw. audiofrequency is necessary at output 27 to modulate the modulated stage 28 of the transmitter, it follows that each of the six radio frequency channels would have to produce 30 kw. The power requirement ahead of the detection rectifiers is actually greater due to the less than 100 percent efficiency of the detection circuits and the precedent phase shift networks, and therefore approximately 33 kw. must be produced at the input to each phase shift network. Noting that the relatively high power level amplification of each RF signal can occur in class C RF amplifiers 221A–C and 221A′–C′ in the polyphase branch signal channels as readily as in a single signal channel, and assuming a readily attainable 75 percent efficiency in each class C amplifier means, it can be determined that the power dissipation for each of the six signal channels would be about 11 kw. and that the total power dissipation would therefore be about 66 kw. This power requirement compares very favorably with that of a conventional Class B modulator (such as modulator 18 in FIG. 1) wherein an overall plate efficiency of about 60 percent pertains, and the comparable power dissipation requirement is about 120 kw. It is best seen that the amplification system of the present invention can provide a quite appreciable gain in overall efficiency at maximal modulation levels. It is also significant that Class B amplification, such as typical of the conventional modulator, has a reduced efficiency in linear relation to the modulation level, with efficiency decreasing at lower average modulation levels. For example, if such a modulator stage is capable of 60 percent efficiency at 100 percent modulation, its efficiency is about 30 percent at 50 percent modulation. In contrast, the efficiency of the present systems is relatively constant for all modulation levels, and the power saving is consequently even more striking for lower percentages of modulation.

In FIG. 4, and in like manner to the detected outputs of the detection means in FIG. 3, the respective detected outputs 74, 74' are combined and the low-order frequency components thereof selected in low-pass filter 76 comprising capacitances 206, 208 and inductance 210, with bypass capacitances 212, 212' and RF chokes 214, 214' being typically provided in the detected signals-combining circuit.

In an amplification system such as shown at FIG. 2 wherein both the AC and DC components of the low-order frequency signal are amplified, the transformer 168, and detection means 172 and low-pass filter 176 can involve utilization of one-half the detection circuit means shown in FIG. 3 if single-phase detection is desired, or one-half the detection circuit means shown in FIG. 4, if polyphase detection is desired.

From the foregoing, various further modifications, circuit arrangements, and adaptations characteristic of the invention will be apparent to those skilled in the art to which the invention is addressed, within the scope of the following claims.

What is claimed is:

1. A high-efficiency electrical signal amplification system for receiving and amplifying to a higher power level a low-frequency input signal from a signal source and applying such amplified signal at the frequency of said input signal to a signal utilization means comprising pulse width modulation means connected to provide a pulsed output signal having a pulse repetition frequency which is at least two times the highest frequency of said low-frequency input signal, said pulsed output signal being pulse-width-modulated in accordance with said low-frequency input signal to produce pulses, each having a width proportional to a corresponding instantaneous value of said low-frequency input signal, pulsed radiofrequency carrier wave means connected to said pulse width modulation means for receiving said pulsed output signal and for providing a keyed radiofrequency output signal of an amplified power level which is greater than the power level of said low-frequency input and pulsed output signals, said keyed radiofrequency output signal including radiofrequency pulses having a repetition frequency which is substantially higher than the pulse repetition frequency of said pulsed output signal and being keyed in response to said pulsed output signal to form amplified pulses having a width and frequency which corresponds substantially to the width and frequency of the pulses of said pulsed output signal, means connected to receive said keyed radiofrequency output signal and operative to derive therefrom an amplified signal having a frequency corresponding to the frequency of said low-frequency input signal, and output means for applying said amplified signal to the input of the utilization means.

2. The electrical signal amplification system of claim 1 which operates to establish the impedance of the signal channel for said input signal to provide an amplified signal having optimum efficiency in said utilization means which includes impedance-matching means connected to said pulsed radiofrequency carrier wave means to receive and pass said keyed radiofrequency output signal to said means for deriving the amplified signal therefrom, said impedance matching means operating to match the impedance of the signal channel for said keyed radiofrequency output signal to that required by the utilization means.

3. The electrical signal amplification system of claim 1 which includes impedance-matching means operative to transform the impedance of said keyed radiofrequency output signal to that required to provide an amplified signal having optimum efficiency in said utilization means, said impedance-matching means including a tuned radiofrequency transformer having a primary connected to receive said keyed radiofrequency output signal and a secondary connected to said means for deriving the amplified signal.

4. The electrical signal amplification system of claim 3 wherein said tuned radiofrequency transformer has a high nonloaded Q and a loaded Q on the order of 3.

5. The electrical signal amplification system of claim 1 wherein said pulse width modulation means includes signal-generating means for generating a pulse signal having a pulse repetition frequency which is at least two times the highest frequency of said low-frequency input signal, and pulse width modulator means for pulse width modulating said pulse signal with said low-frequency input signal to provide said pulsed output signal having pulses of equal amplitude.

6. The electrical signal amplification system of claim 1 wherein said pulsed radiofrequency carrier wave means includes radiofrequency signal-generating means for generating a carrier signal of radiofrequency pulses having a repetition frequency which is substantially higher than the pulse repetition frequency of said pulsed output signal, amplifier means connected to receive said carrier signal and said pulsed output signal, said amplifier means operating to increase the power level of said carrier wave and to key said carrier wave with said pulsed output signal to form said keyed radiofrequency output signal including pulses of equal amplitude.

7. The electrical signal amplification system of claim 6 wherein the frequency of said carrier signal is at least ten times the frequency of said pulsed output signal.

8. The electrical signal amplification system of claim 6 wherein said amplifier means includes a Class C type amplifier.

9. The electrical signal amplification system of claim 1 wherein said means for deriving an amplified signal includes detector means for receiving said keyed radiofrequency output signal and isolating therefrom an amplified width-modulated signal of greater amplitude than said pulsed output signal but having a pulse repetition frequency and pulse-width-modulated pulses corresponding to said pulsed output signal.

10. The electrical signal amplification system of claim 9 wherein said means for deriving an amplified signal includes filter means connected to receive said amplified width-modulated signal and isolating said amplified signal therefrom.

11. The electrical signal amplification system of claim 1 wherein said pulsed output signal is modulated to include pulses each having a width proportional to a corresponding instantaneous amplitude of said low-frequency input signal.

12. The electrical signal amplification system of claim 5 wherein said pulse width modulator means operates to maintain a modulating level wherein the pulses of said pulse signal are at a median width coincident with the instantaneous zero value of said input signal with said pulse width progressively increasing coincident with positive values of said input signal and progressively decreasing coincident with negative values of said input signal.

13. A high-efficiency electrical signal amplification system for receiving and amplifying to a higher power level a low-frequency input signal from a signal source and which operates to establish the impedance of the signal channel for said input signal to provide an amplified output signal having optimum efficiency in a utilization means therefor comprising pulse width modulation means connected to provide a pulsed output signal composed of equal amplitude pulses having a pulse repetition frequency which is higher than the highest frequency of said low-frequency input signal, said pulse width modulation means operating to pulse-width-modulate said pulsed output signal in accordance with said low-frequency input signal to produce pulses, each having a width proportional to a corresponding instantaneous value of said low-frequency input signal, pulsed radiofrequency carrier wave means connected to said pulse width modulation means for receiving said pulsed output signal and for providing a keyed radiofrequency output signal of an amplified power level which is greater than the power level of said low-frequency input and pulsed output signals, said pulsed radiofrequency carrier wave means operating to provide said keyed radiofrequency output signal with equal amplitude, radiofrequency pulses having a repetition frequency which is substantially higher than the pulse repetition frequency of said pulsed output signal keyed in response to said pulsed output signal to form amplified pulses having a width and repetition frequency which corresponds substantially to the width and repetition frequency of the pulses of said pulsed output signal, radiofrequency impedance-matching means connected to said pulsed radiofrequency carrier wave means to receive and pass said keyed radiofrequency output signal, said radiofrequency impedance matching means operating to transform the impedance of said keyed radiofrequency output signal to that required to provide an amplified signal having optimum efficiency in a utilization means therefor, and means connected to said radiofrequency impedance matching means to receive said keyed radiofrequency output signal and operative to derive therefrom an amplified output signal having a frequency corresponding to the frequency of said low-frequency input signal.

14. The electrical signal amplification system of claim 13 wherein said input signal is in the audiofrequency range and the repetition frequency of said pulsed output signal is in the ultraaudiofrequency range.

15. The electrical signal amplification system of claim 13 which includes gate means connected to receive said input signal and separate the input signal into positive and negative portions, said pulse width modulation means including negative channel modulator means connected to receive the negative portion of said input signal and provide a negative channel-width-modulated pulsed output signal in accordance therewith and positive channel modulator means connected to receive the positive portion of said input signal and provide a positive channel-width-modulated pulsed output signal in accordance therewith, said pulsed radiofrequency carrier wave means including negative channel amplification means connected to receive said negative channel-pulsed output signal and to provide a negative channel-keyed radiofrequency output signal keyed in response to said negative channel-pulsed output signal and positive channel amplification means connected to receive said positive channel-pulsed output signal and to provide a positive-channel-keyed radio frequency output signal keyed in response to said positive channel-pulsed output signal and said radiofrequency impedance-matching means including a negative channel radiofrequency impedance-matching unit connected to said negative channel amplification means to receive said negative channel-keyed radiofrequency output signal and a positive channel radiofrequency impedance-matching unit connected to said positive channel amplification means to receive said positive channel-keyed radiofrequency output signal.

16. The electrical signal amplification system of claim 15 wherein said means to derive the amplified signal from said keyed radiofrequency output signal includes detection means connected to receive said negative and positive channel-keyed radiofrequency output signals and isolate respectively therefrom negative and positive channel-amplified width-modulated signals of greater amplitude than said negative and positive channel-pulsed output signals but having a pulse repetition frequency and pulse-width-modulated pulses corresponding thereto, said detection means including a negative channel detector to provide said negative channel-amplified width-modulated signal and a positive channel detector to provide said positive channel-amplified width-modulated signal.

17. The electrical signal amplification system of claim 16 which includes a single low-pass filter means connected to said negative and positive channel detectors to receive said negative and positive channel-amplified width-modulated signals, said low-pass filter means operating to isolate said amplified output signal therefrom.

18. The electrical signal amplification system of claim 17 wherein said negative and positive channel detectors are full-wave rectifiers.

19. A high-efficiency electrical signal amplification system for receiving and amplifying to a higher power level a low-frequency input signal from a signal source and which operates to establish the impedance of the signal channel for said input signal to provide an amplified output signal having optimum efficiency in a utilization means therefor comprising pulse width modulation means connected to provide a pulsed output signal composed of equal amplitude pulses having a pulse repetition frequency which is higher than the highest frequency of said low-frequency input signal, said pulse width modulation means operating to pulse-width-modulate said pulsed output signal in accordance with said low-frequency input signal to produce pulses, each having a width proportional to a corresponding instantaneous value of said low-frequency input signal, pulsed radiofrequency carrier wave means connected to said pulse width modulation means for receiving said pulsed output signal and for providing a keyed radiofrequency output signal of an amplified power level which is greater than the power level of said low-frequency input and pulsed output signals, said pulsed radiofrequency carrier wave means operating to provide said keyed radiofrequency output signal with equal amplitude, radiofrequency pulses having a repetition frequency which is substantially higher than the pulse repetition frequency of said pulsed output signal keyed in response to said pulsed output signal to form amplified pulses having a width and repetition frequency which corresponds substantially to the width and repetition frequency of the pulses of said pulsed output signal, and means connected to receive said keyed radiofrequency output signal and operative to derive therefrom an amplified output signal having a frequency corresponding to the frequency of said low-frequency input signal, said means for deriving said amplified output signal including phase shift means connected to said pulsed radiofrequency carrier wave means for dividing said keyed radiofrequency output signal into a plurality of phase-related components, a radiofrequency impedance matching means connected to said phase shift means to receive said phase-related components therefrom, said radiofrequency impedance-matching means operating to transform the impedance of said phase-related components to that required to provide an amplified output signal having optimum efficiency in a utilization means therefor, detector means connected to receive said phase-related components from said radiofrequency impedance-matching means, and a single filter means connected to receive the output from said detector means.

20. The electrical signal amplification system of claim 19 wherein said radiofrequency impedance-matching means includes a separate tuned radiofrequency transformer connected to receive each such phase-related component and said detector means includes a separate half-wave rectifying detector connected to each said tuned radiofrequency transformer.

21. The electrical signal amplification system of claim 20 wherein said detection means includes a DC return circuit which includes a grid-controlled power tube biased to cut off each half-wave rectifier except for a minor portion of the excursion cycle of the phase-related component applied thereto.

* * * * *